United States Patent [19]

Kaanta et al.

[11] Patent Number: 5,144,411
[45] Date of Patent: Sep. 1, 1992

[54] METHOD AND STRUCTURE FOR PROVIDING IMPROVED INSULATION IN VLSI AND ULSI CIRCUITS

[75] Inventors: Carter W. Kaanta, Colchester; Stanley Roberts, Colchester, both of Vt.

[73] Assignee: International Business Machines Corporation, Armonk, N.Y.

[21] Appl. No.: 590,290

[22] Filed: Sep. 28, 1990

Related U.S. Application Data

[62] Division of Ser. No. 286,443, Dec. 16, 1988, Pat. No. 4,987,101.

[51] Int. Cl.$^5$ ............................................. H01L 23/48
[52] U.S. Cl. ...................................... 357/68; 357/55; 357/69; 357/74
[58] Field of Search ................... 357/68, 69, 74, 51, 357/55

[56] References Cited

U.S. PATENT DOCUMENTS

| | | | |
|---|---|---|---|
| 3,689,992 | 9/1972 | Schutze et al. | 437/65 |
| 3,908,186 | 9/1975 | Anazawa et al. | 357/68 |
| 3,925,880 | 12/1975 | Rosvold | 29/578 |
| 4,975,762 | 12/1990 | Stradley | 357/74 |

FOREIGN PATENT DOCUMENTS 0223145  11/1985  Japan ...................................... 357/68

*Primary Examiner*—Edward J. Wojciechowicz
*Attorney, Agent, or Firm*—Calfee, Halter & Griswold

[57] ABSTRACT

An improved VLSI or ULSI structure and a method of forming the same are provided. The structure starts with a base member having a plurality of supports formed thereon and extending upwardly therefrom. A selectively removable material is deposited on the base member and around the supports. An insulating cap is formed over the supports and the removable material. Access openings are provided through the cover (or base) and the removable material is removed through the access openings. Thereafter a partial vacuum is formed in the space evacuated by the removable material, and the access openings sealed to provide a dielectric medium around the supports and between the base and cap member having a dielectric constant of less than 2.0.

4 Claims, 6 Drawing Sheets

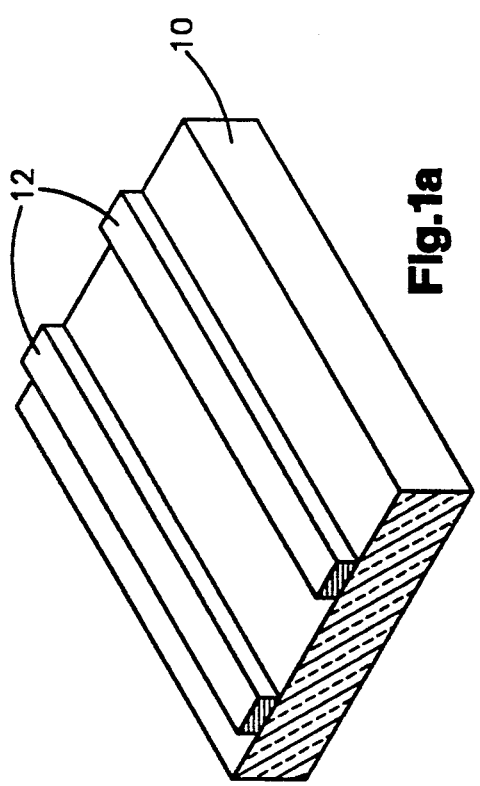
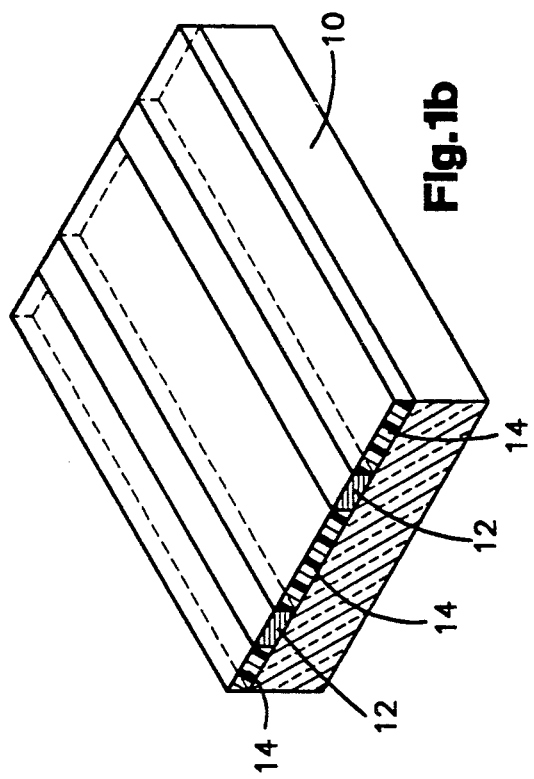
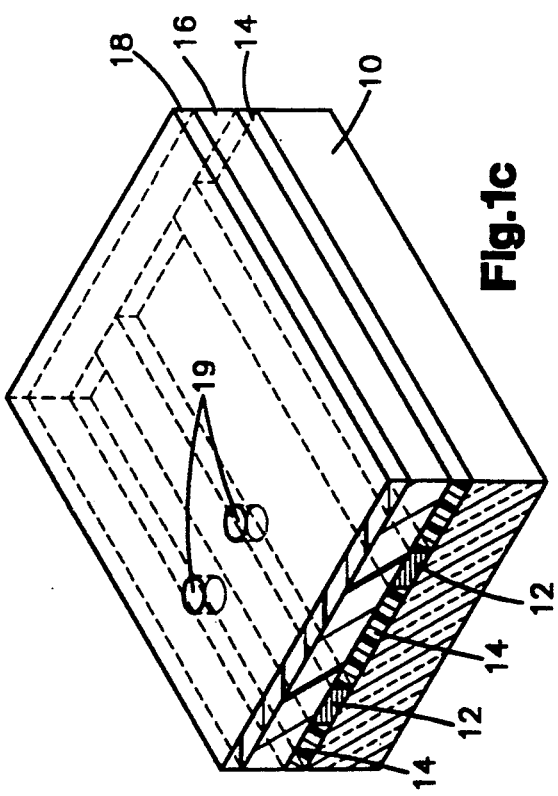
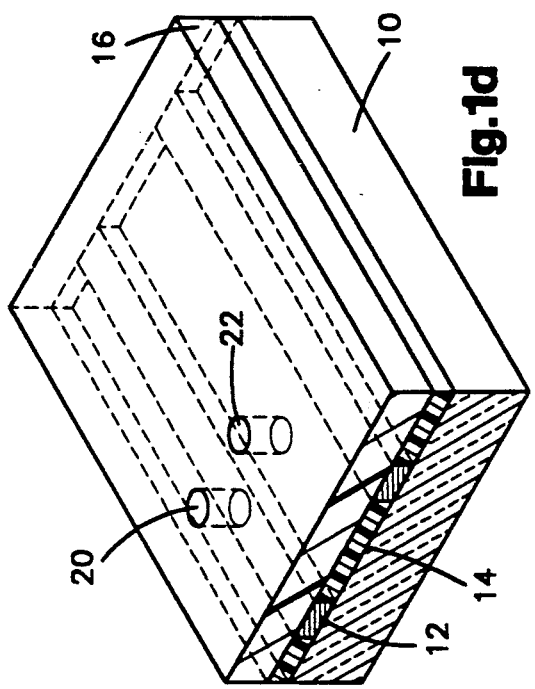

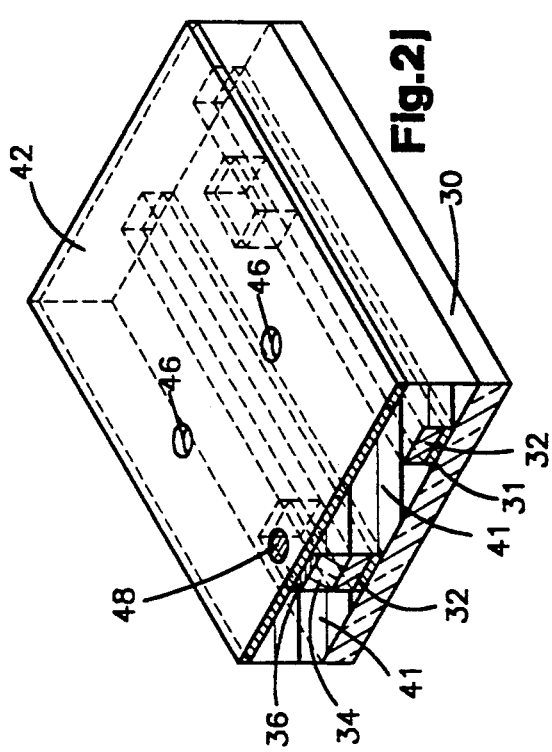
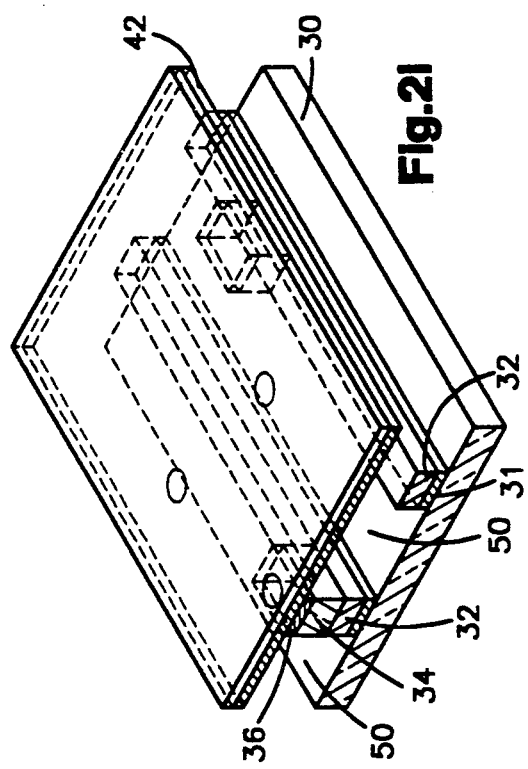
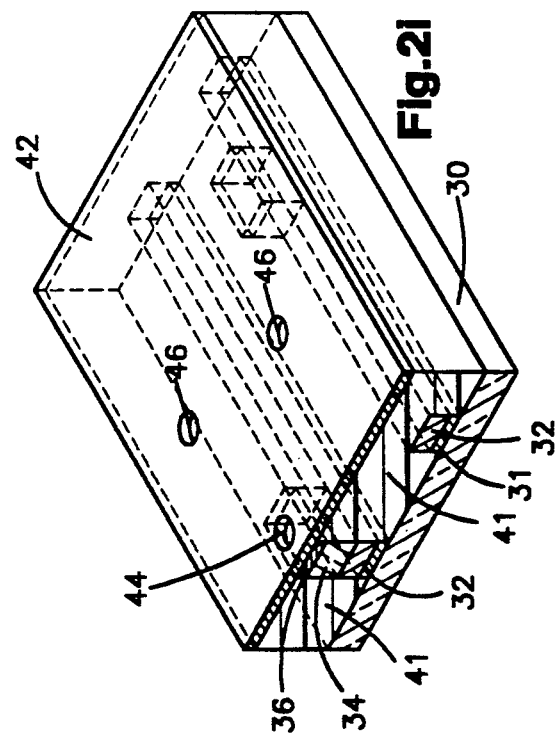
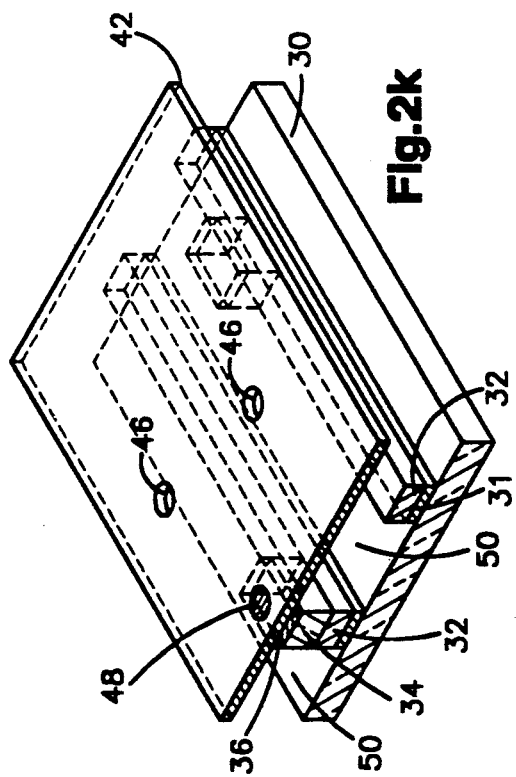

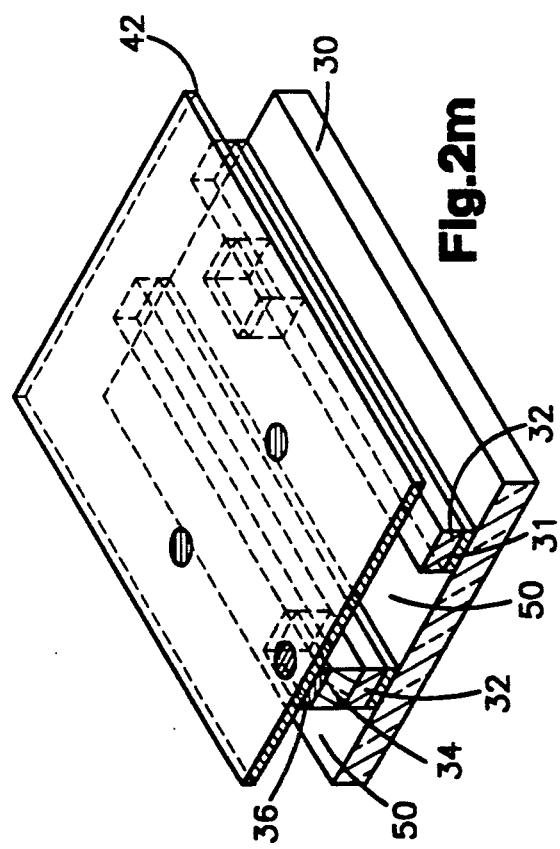

METHOD AND STRUCTURE FOR PROVIDING IMPROVED INSULATION IN VLSI AND ULSI CIRCUITS

This is a divisional of co-pending application Ser. No. 286,443 filed on Dec. 16, 1988, now U.S. Pat. No. 4,987,101.

BACKGROUND OF THE INVENTION

This invention relates generally to a method and structure for reducing the capacitive coupling either between lines on the same layer (intralayer) or between lines on superposed layers (interlayer) in VLSI or ULSI circuits. In more particular aspects the present invention relates to a method and structure for yielding an effectively reduced dielectric constant between lines on the surface of a given VLSI or ULSI chip or on lines mounted on various layers or surfaces on VLSI or ULSI structures utilizing air, other gasses, or a partial vacuum as a dielectric medium.

PRIOR ART

It has been conventional prior art practice in integrated circuit chip production to utilize materials such as silicon dioxide, silicon nitride, polyimides and certain other organic materials as dielectric materials interposed between the metal lines on a given layer and between various layers of metalization in the wiring portion of the integrated circuit chip.

However, as the integrated circuit technology prograsses into a Very Large Scale Integration (VLSI) and beyond to Ultra Large Scale Integration (ULSI) the spacing between the metal lines on any given plane and the interplanar spacing of metal lines becomes less and less, extending into the submicron range for intralayer spacing. This increases the capacitive losses between the lines and gives rise to a need for the space between the lines having improved dielectric properties; i.e., with a dielectric constant as low as possible.

The dielectric constants of silicon nitride (which is about 7.0), CVD silicon dioxide (which is 3.9), and polyimides (which are about 3.6), are not sufficiently low to provide acceptable insulation in these submicron ranges; hence, it is necessary to provide a medium with improved dielectric properties, e.g. a constant of 2.0 or less in the intraplanar spaces between lines and interplanar spaces between lines at different levels.

SUMMARY OF THE PRESENT INVENTION

According to the present invention a method and structure for providing an insulating electrical space between two lines on a layer of material or between lines on adjacent superposed layers of material are provided. According to this invention a base member is formed having a plurality of support members extending upwardly from said base member. A removable material is deposited on said base member and around said support members. A cap member of insulating material is then disposed over said support members and said removable material. Access openings are formed in at least one of the base member or the cap member communicating with said removable material. The removable material is removed through the access openings to thereby define a space between said cap member and said base member and between said support members. During this step a partial vacuum (in which some inert gas may be dispersed) may be created in the space vacated by the removable material. The access openings are then filled in so as to provide a sealed space between the cap member and the base member which has a very low dielectric constant.

DESCRIPTION OF THE DRAWINGS

FIGS. 1a through 1h are perspective sectional views somewhat diagrammatic showing various steps in one method of producing a structure according to this invention; and FIGS. 2a through 2m are perspective sectional views somewhat diagrammatic showing various steps in another method of producing a structure according to this invention.

DESCRIPTION OF THE PREFERRED EMBODIMENT

Figure 1E:
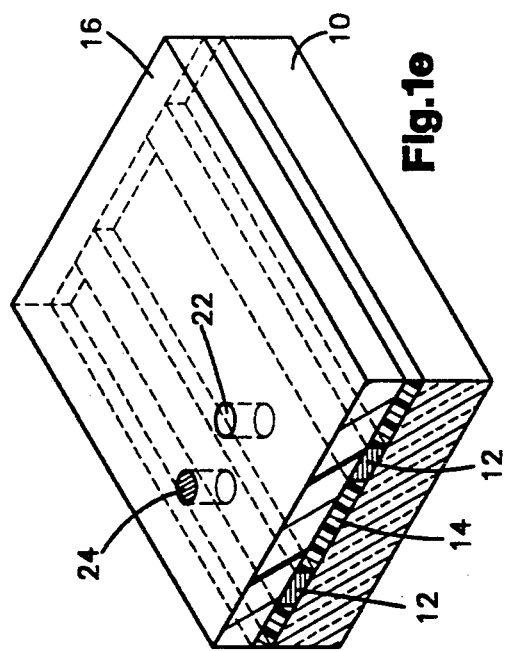

Referring now to the drawing and for the present FIGS. 1a through 1f the various steps in producing a structure according to one method of the present invention are depicted, somewhat diagrammatically. As shown in FIG. 1a an insulating substrate material 10 such as $SiO_2$ is provided which may overlie the devices on a VLSI or ULSI integrated circuit chip (not shown). The insulating material 10 has disposed thereon metal lines 12 which may be aluminum or other metal which have been patterned by conventional photolithographic techniques to provide the desired wiring structure on top of the insulating layer 10. A layer of removable material 14 is deposited atop the substrate material 10 and around the metal lines 12. The preferred material for this is a poly-para-xylylene, (PPX) an organic polymer sold by Union Carbide Corporation, under the Trademark Parylene N, which can be readily selectively removed under certain specific conditions as will be described presently. However, other removable materials which have the property of being etched or consumed at a rate significantly and substantially faster than any of the material surrounding it (i.e. the metal and silicon dioxide) can also be used. Other such additional materials include spun on glasses which can be removed in HF acid etch.

When parylene is used, this can be deposited by chemical vapor deposition (CVD) techniques which are well known in the art. For example, CVD deposition by the Gorham method is a very good technique. This is done after first optionally applying an adhesion promoter such as A1100 sold by Shipley Co. Thereafter the PPX is applied by heating the PPX source material to 165° C. and passing the vapor through a furnace in a tube at 425° C. and thereafter depositing the heated vapor onto the substrate in a chamber at 40 microns pressure and room temperature. When the material has been deposited it is planarized by a suitable technique such as an etch back or other planarization techniques so that the top surface is flush with the top of the metal lines 12. One such etch back technique is as follows: A layer of planarizing resist material, such as AZ1350 sold by Shipley Co. is spun applied and then baked at about 120° C. This is followed by etching in $O_2$ in a reactive ion etching tool. This etching continues until all the resist has been removed and the resulting structure is a planarized surface of parylene 14 and metal lines 12. This structure is shown in FIG. 1b.

An insulating cap material 16 is then deposited on top of the planarized parylene surface and metal, which cap preferably also is silicon dioxide which can be deposited by conventional techniques. In one such technique the $SiO_2$ is deposited in an AME 3300 deposition tool using 1.9% $SiH_4$ with He at 3000 sccm, and $N_2O$ at 2500 sccm, carried out at a pressure of 2.0 Torr, a temperature of 340° C., and a power of 150 watts. Following this, a layer of photoresist material 18 is deposited on top of the insulating material 16 and patterned by conventional photolithographic processes so as to provide the desired opening configurations 19 for access to the metal lines and to parylene material as will become clear presently and as shown in FIG. 1c.

The revealed $SiO_2$ material on the cap 16 underlying the openings 19 is removed by any conventional etching technique utilizing the unexposed remaining photoresist material 18 as a mask. One such technique being as follows: The $SiO_2$ is etched in an AME 8100 etching tool using $CHF_3$ at 75 sccm, and $CO_2$ at 8 sccm, carried out at 40 millitor, at ambient temperature and at a power of 1200 watts. The remaining photoresist 18 is then removed. This will result in the structure shown in FIG. 1d. As can be seen in FIG. 1d there are a plurality of openings one of which is shown at 20, which extends through the cap material 16 to the underlying metalization layer 12, while other openings, one of which is shown at 22, extend through the insulating cap material 16 and communicate with the underlying parylene material 14. The openings 20 will be used to provide interlayer contact and the openings 22 will be used as access openings to remove the material 14 as will be described presently.

A metal such as tungsten 24 is deposited in the openings 20 as shown in FIG. 1e which can be effectively accomplished by selective deposition as follows: The tungsten is deposited in a Varian 5100 tool, using $WF_6$ at 10 sccm, $H_2$ at 200 sccm, $SiH_4$ at 10 sccm and at a temperature of about 300° C.

Figure 1F:
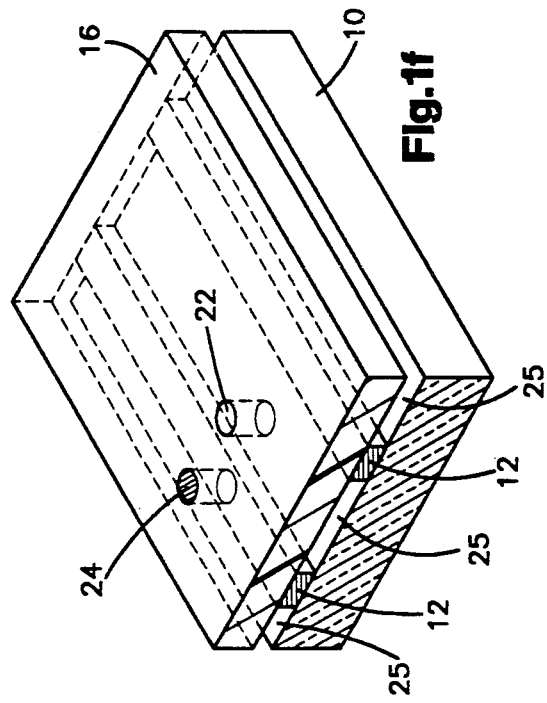

Following the tungsten deposition, the parylene material is removed through the access openings by heating the entire structure in an $O_2$ rich atmosphere at a temperature of about 200° C. This will cause the perylene material 14 to react with the oxygen in the atmosphere and essentially turn to gas and be expelled through the access openings 22 leaving spaces 25 between the metal lines 12 and between the base layer 10 and the cap 16 as shown in FIG. 1f.

At this point in the process, the access openings 22 are filled, preferably by a technique of CVD deposition of $SiO_2$ utilizing an inert carrier gas at a pressure of about 100 millitorr. This is quite a low pressure and any ambient atmosphere which is contained within the spaces between the base 10 and cap 16 and between the metal lines 12 is replaced by the vacuum and a certain small amount of whatever carrier gas is used to perform chemical vapor deposition of the $SiO_2$. This chemical deposition of $SiO_2$ will effectively close the access openings 22, and, since the process is being carried out at the very low pressure of 100 millitorr with inert carrier gas the resulting space between the metal lines 14 has a very low pressure therein containing only small amounts of inert gas. This will give a dielectric constant of 2.0 or less.

Figure 1G:
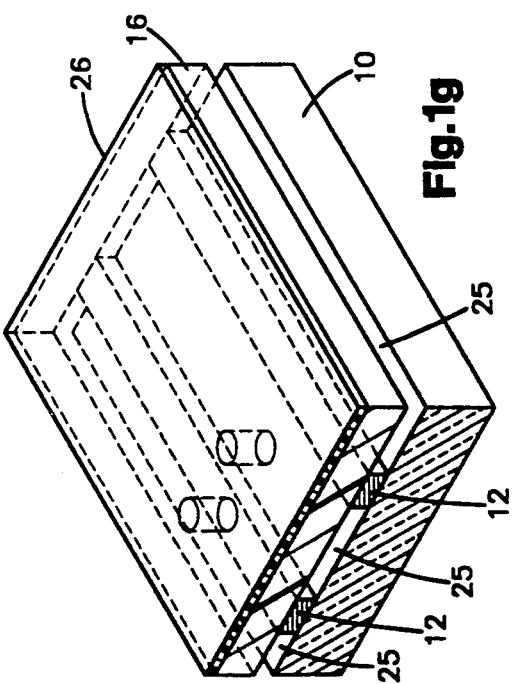
Figure 1H:
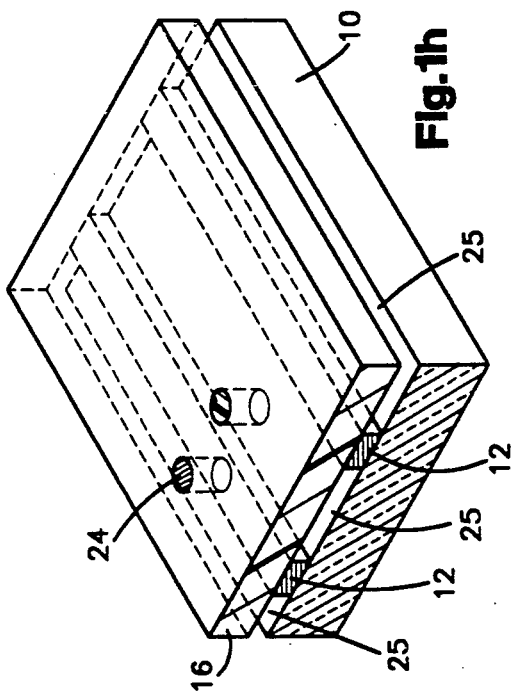

In the deposition of the $SiO_2$ on the cap 16 to close the access openings 22 there will also be a layer 26 of the $SiO_2$ material deposited on the top thereof as shown in FIG. 1g. This layer 26 is then blanket etched by the reactive ion etching (R.I.E.) process as described above to expose the top of the tungsten as shown in FIG. 1h, which can then act as a via or stud for interlayer connection. The desired metallization can then be applied to the top of the cap layer 16, and the whole process repeated if additional layers of metallizations are desired.

Referring now to FIGS. 2a through 2m the steps in another embodiment of this invention are shown which is particularly effective for providing not only intralayer insulation between two metal lines on a given layer, but also is especially effective for providing interlayer insulation of metal lines on two superposed layers of insulation.

In this embodiment, a first layer of metal 31 such as tungsten is blanket deposited onto an insulating substrate 30 such as silicon dioxide by any suitable deposition technique. One such technique is a sputter process utilizing a Perkins-Elmer 4450 tool at 600 watts D.C. magnetron sputtering at 10-30 millitorr pressure with a bias of between 0 and $-60$ volts. Thereafter a layer of aluminum is blanket deposited onto the tungsten by any suitable process. This aluminum can be deposited by using an RF evaporation source at a pressure of about 1 microtorr. On top of the aluminum metal 32, a silicon dioxide layer 34 is deposited as previously described. On top of the silicon dioxide layer 34 a layer of silicon nitride 36 is deposited. The silicon nitride deposition is preferably done in an ASM tool utilizing $SiH_4$ at 175 sccm, and $NH_3$ at 325 sccm, carried out at a pressure of 2 torr, a temperature of 375° C., and a power of 160 watts. This is the starting structure and is shown in FIG. 2a.

Figure 2B:
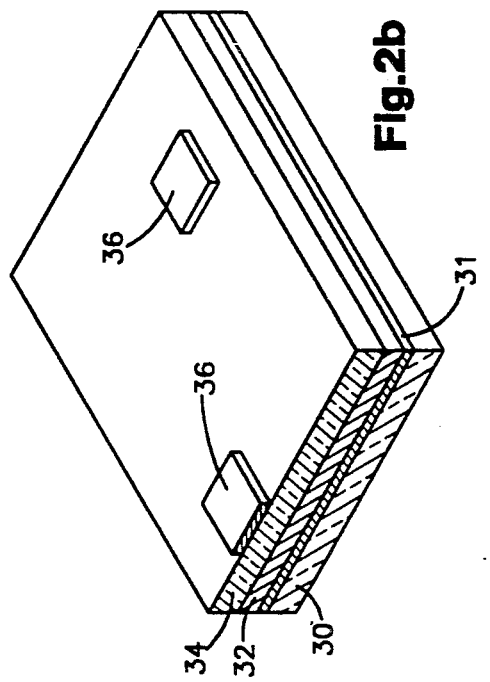
Figure 2D:
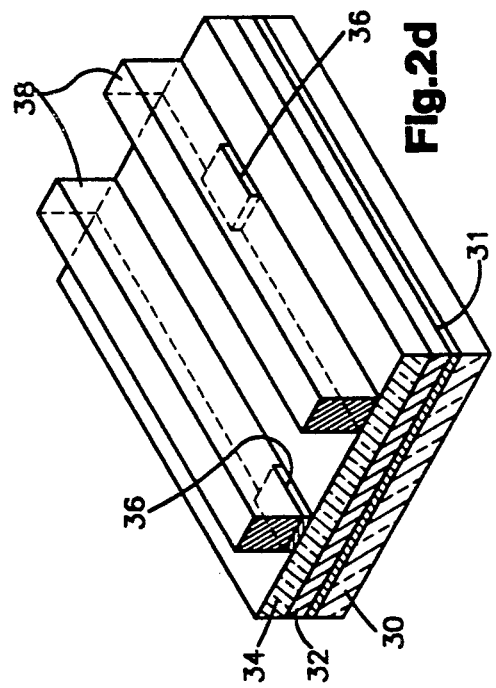
Figure 2A:
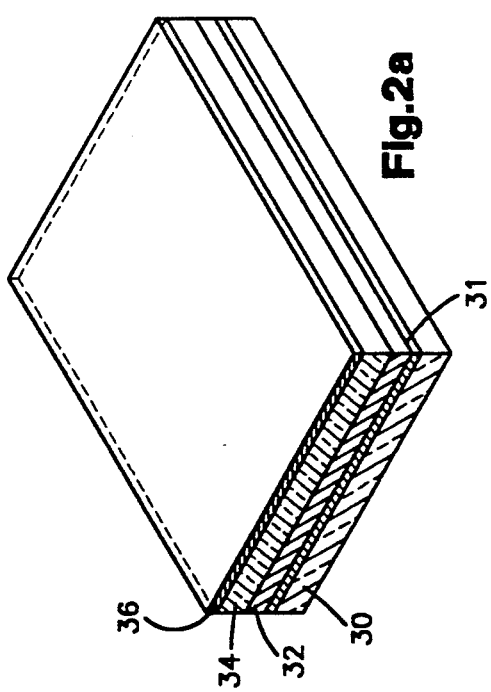

The overlying silicon nitride layer 36 is then patterned by convention photolithographic techniques and reactive ion etched to provide the structure shown in FIG. 2b wherein there are a series of pads of silicon nitride 36 atop the silicon dioxide layer 34.

Figure 2C:
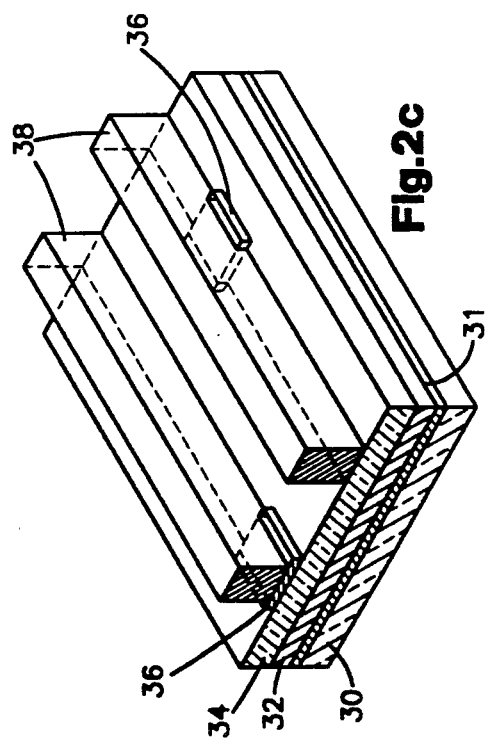

A layer of photoresist material 38 is then deposited over the surface of the structure shown in FIG. 2b and patterned and developed in a conventional manner to provide the pattern shown in FIG. 2c. The pattern of the photoresist 38 corresponds to the desired pattern of lines which will be etched in the underlying metal layer 32 as will become apparent presently.

The silicon nitride pads 36 have been intentionally made slightly wider than the width of the photoresist pattern material 38 so as to provide a self-aligning feature which is well known in the art. At this point the excess nitride 36 is trimmed in an AME Hexode tool using $CHF_3$ at 75 sccm, and $O_2$ at 10 sccm, carried out at a power of 800 watts. This provides the structure shown in FIG. 2d.

Figure 2E:
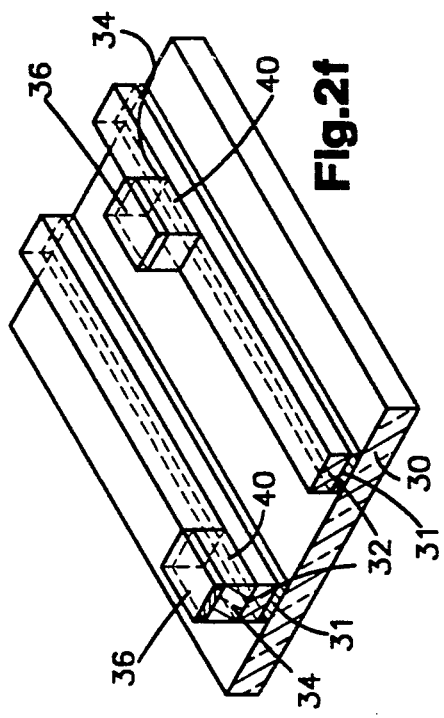

At this point the structure is etched using the undeveloped photoresist pattern 38 as a mask, the etching first being through the exposed silicon dioxide 34 down to the exposed metal layer 32 and thereafter the aluminum metal layer 32 is etched so as to reveal the underlying tungsten 31 and provide a line pattern as shown in FIG. 2e. This etching takes place by the following process: First the $SiO_2$ is etched as previously described until it is completely removed to expose the aluminum metal. The aluminum is etched in an AME 8300 tool using a multi-step process as follows:

first in $CF_4$ at 40 sccm, carried out at a pressure of 25 millitorr with a D.C. bias of 25 volts;

thereafter in $BCl_3$ at 140 sccm, $Cl_2$, at 30 sccm, $CH_3$ at 15 sccm, and $CH_4$ at 15 sccm, carried out at a pressure of 30 millitorr and a D.C. bias of $-160$ volts until the unmasked aluminum is removed.

Figure 2F:
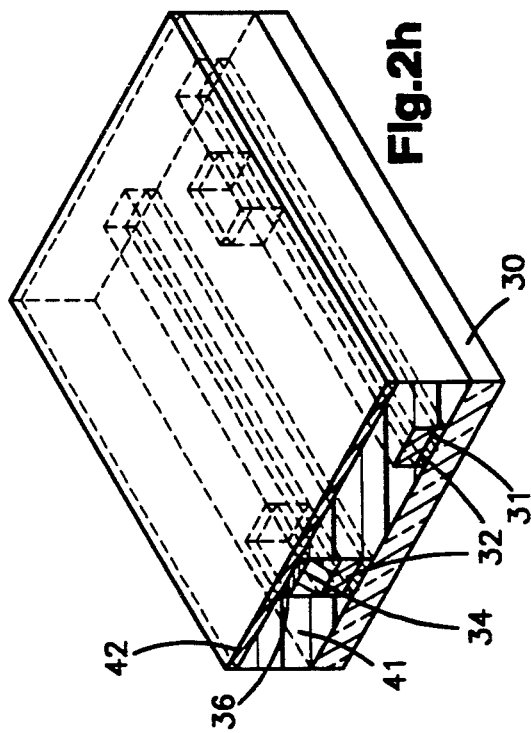

At this point the remaining photoresist 38 is stripped away. The silicon dioxide which underlies the photoresist but which is not covered by the Si$_3$N$_4$ pads 36 is removed by etching as previously described, the pads 36 acting as etch marks on the SiO$_2$ layer 34 and the tungsten 31 acting as an etch mask on the SiO$_2$ layer 30. The tungsten 31 is then removed by any suitable means, such as by reactive ion etching in a suitable gas such as SF$_6$ at a rate of 150 nm per minute. This will provide the structure as sown in FIG. 2f. At this stage in the process underlying aluminum metal lines 32 have disposed thereon stanchions 40, two of which is shown in FIG. 2f, each stanchions being comprised of a silicon nitride layer 36 and a silicon dioxide layer 34.

Figure 2G:
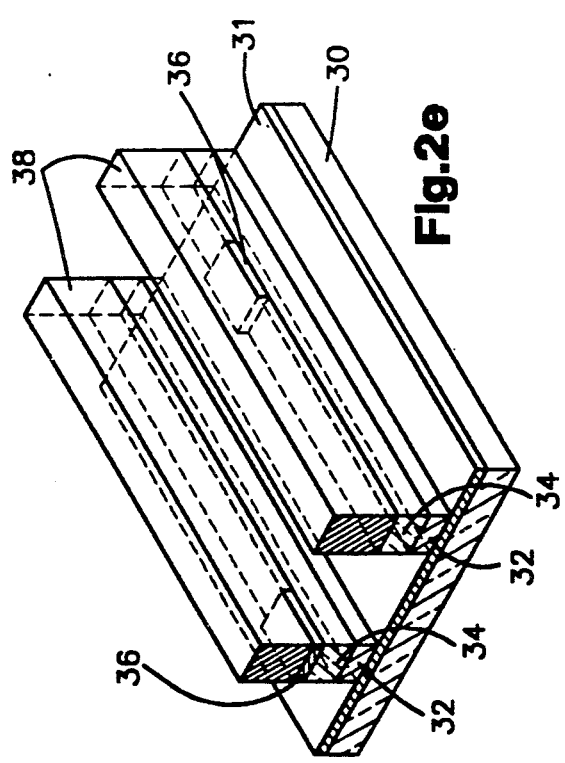

Removable material 41 such as parylene is deposited (as previously described) onto the surface of the substrate 30 so that it fills between the metal lines 32 and around the stanchions 40, and is planarized back as previously described to the structure shown in FIG. 2g. (The silicon nitride need not remain after this point in the process, and if desired can be removed as a part of the planarization operation using conventional techniques as previously described.)

Figure 2H:
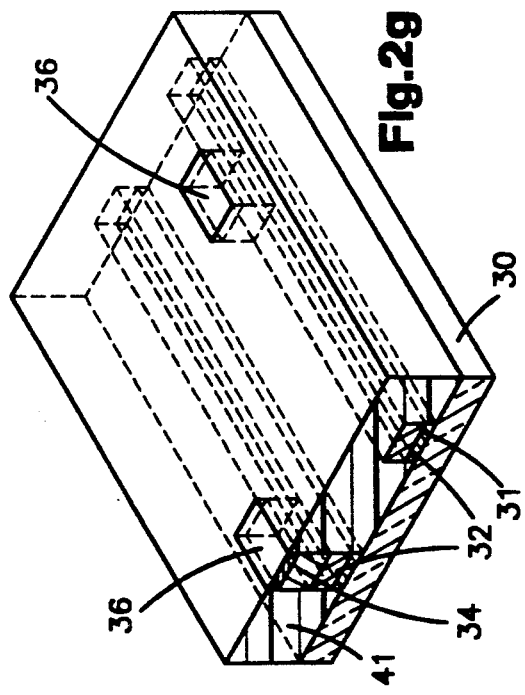

A cap layer 42 of silicon dioxide is then blanket deposited on top of the structure shown in FIG. 2h. A layer of photo resist is deposited on the cap layer 42 and patterned and developed as described in the previous embodiment to provide for the necessary via and access openings. Via openings, one of which is shown at 44, and access openings 46, are etched through the silicon dioxide cap layer 42 by the technique as previously described, the via openings being located above the stanchions 40 and the removal or access openings 46 being located above the removable material 41 and the photoresist material removed to provide the structure as shown in FIG. 2i. It should be noted that the etching of the via hole 44 proceeds through both the oxide cap material 42 and the silicon nitride 36 and the underlying oxide material 34 to the metal 32. This etching process is carried out in an AME 8100 etching tool wherein the SiO$_2$ is first etched as previously described to remove the SiO$_2$ revealing the silicon nitride. The silicon nitride is then etched in an AME Hexode tool as previously described to reveal the SiO$_2$. This final layer of SiO$_2$ is etched as previously described to reveal the underlying aluminum lines.

As in the previously described embodiment, metal 48 is deposited into the via 44 to provide an interconnection which preferably is tungsten as previously described and shown in FIG. 2j. The material 41 is then removed as previously described. If the material is parylene it is removed by heating the structure in an O$_2$ atmosphere at about 200° C. or less until the material is removed as shown in FIG. 2k providing spaces 50 between the lines 32 and between the base 30 and cap 42. If the material is spun on glass it can be etched out by a solution of 100 parts HNO$_3$, 100 parts H$_2$O, and 1 part HF. If other material is used it can be suitably removed by selecting enchants that do not significantly react either with the silicon dioxide, or the silicon nitride or the metal.

The structure is then subjected to a CVD silicon dioxide deposition as previously described to close the access openings 46 and provide a layer 52 on top of cap 42 which when done at a pressure of 100 millitorr will result in a relatively low pressure spaces 50 as shown in FIG. 2l. The layer 52 is then etched back as previously described to provide the resulting structure shown in FIG. 2m.

This particular embodiment is particularly adapted not only for use with intralayer insulation but also interlayer insulation in that there is provided a plurality of stanchions or supports 40 separating the base layer 30 and cap layer 42, which stanchions are comprised of a layer of silicon dioxide and silicon nitride overlying the metal lines 32 thus increasing the space 50 constituting the space between the layer 32 and the cap 42.

While several embodiments of this invention have been shown and described, various adaptations and modifications can be made without departing from the scope of the invention as defined in the appended claims.

What is claimed is:

1. A VLSI or ULSI chip carrier structure for mounting a chip comprising:
   a. a dielectric base member of insulating material,
   b. a plurality of discrete spaced metal conducting lines formed on said base member and extending upwardly therefrom;
   c. a dielectric cap member of insulating material superimposed over said base member and supported at least in part by said metal lines;
   d. said cap member, said base member, and said metal lines defining a plurality of spaces therebetween, each of said spaces having a dielectric constant of less than 2.0;
   e. wherein said cap member is characterized by the presence of access openings, said access openings being sealed with an insulating material, and said cap member further characterized by the presence of openings for providing interlayer contact, said openings being filled with metal.

2. The invention as defined in claim 1 wherein said cap member is supported directly on said metal lines.

3. The invention as defined in claim 1 wherein a plurality of insulation stanchions are formed on said metal lines, and said cap member is supported directly on said insulation stanchions and indirectly on said metal lines.

4. The invention as defined in claim 1 further characterized by metal vias extending through said cap member and contacting said metal lines.

* * * * *